(12) United States Patent
Tuttle (10) Patent No.: US 10,307,850 B2
(45) Date of Patent: Jun. 4, 2019

(54) SOLDER REMOVAL FROM SEMICONDUCTOR DEVICES

(71) Applicant: Micron Technology, Inc., Boise, ID (US)

(72) Inventor: Mark E. Tuttle, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/686,008

(22) Filed: Aug. 24, 2017

(65) Prior Publication Data

US 2019/0061034 A1 Feb. 28, 2019

(51) Int. Cl.
*B23K 31/02* (2006.01)
*B23K 1/018* (2006.01)
*H01L 23/00* (2006.01)
*H01L 21/66* (2006.01)
*B23K 101/40* (2006.01)

(52) U.S. Cl.
CPC .............. *B23K 1/018* (2013.01); *H01L 22/32* (2013.01); *H01L 24/799* (2013.01); *H01L 24/98* (2013.01); *B23K 2101/40* (2018.08); *H01L 2224/7999* (2013.01); *H01L 2224/98* (2013.01)

(58) Field of Classification Search
CPC ................ B23K 1/018; B23K 2101/40; B23K 1/00–206; B23K 3/00–087; H01L 24/98; H01L 24/799; H01L 22/32; H01L 2224/98; H01L 2224/7999
USPC ...................... 228/13, 19–20.5, 119, 191, 264
See application file for complete search history.

(56) References Cited

U.S. PATENT DOCUMENTS

| | | | | | |
|---|---|---|---|---|---|
| 3,084,649 | A | * | 4/1963 | Parstorfer | H05K 13/0491 219/227 |
| 3,211,354 | A | * | 10/1965 | Dugard | B23K 1/018 219/230 |
| 3,813,023 | A | * | 5/1974 | Auray | B23K 3/025 219/229 |
| 4,034,202 | A | * | 7/1977 | Vandermark | B23K 3/025 219/230 |
| 4,187,972 | A | * | 2/1980 | Vella | B23K 1/018 219/238 |
| 4,187,973 | A | * | 2/1980 | Fortune | B23K 1/018 219/230 |
| 4,206,864 | A | * | 6/1980 | Rauchwerger | B23K 1/018 15/341 |
| 4,637,542 | A | * | 1/1987 | Breske | B23K 3/025 228/180.1 |
| 4,666,076 | A | * | 5/1987 | Wallgren | B23K 1/018 228/20.5 |
| 4,686,737 | A | * | 8/1987 | Fortune | B23K 1/018 15/341 |

(Continued)

FOREIGN PATENT DOCUMENTS

CN 101850451 A * 10/2010 ............. B23K 1/018

*Primary Examiner* — Kiley S Stoner
(74) *Attorney, Agent, or Firm* — Perkins Coie LLP (57) ABSTRACT

A solder removal apparatus is provided. The solder removal apparatus comprises a plurality of solder-interfacing protrusions extending from a body by a length. Each of the plurality of solder-interfacing protrusions is configured to remove a corresponding one of a plurality of solder features from a semiconductor device, where each of the plurality of solder features has a height and an amount of solder material.

6 Claims, 5 Drawing Sheets

(56) References Cited

U.S. PATENT DOCUMENTS

| | | | | |
|---|---|---|---|---|
| 5,143,272 | A | * | 9/1992 | Carlomagno .......... B23K 3/029 228/20.5 |
| 5,350,282 | A | * | 9/1994 | Ting ...................... B23K 3/029 417/402 |
| 5,540,377 | A | * | 7/1996 | Ito ........................ B23K 3/0607 228/41 |
| 5,565,119 | A | * | 10/1996 | Behun ..................... B29C 66/43 219/121.63 |
| 5,909,838 | A | * | 6/1999 | Jimarez ................. B23K 1/018 228/125 |
| 6,460,755 | B1 | * | 10/2002 | Inoue ................... B23K 3/0623 228/180.22 |
| 2004/0222206 | A1 | * | 11/2004 | Nagase ................... C22C 38/16 219/229 |
| 2005/0205643 | A1 | * | 9/2005 | Choi ..................... B23K 1/018 228/19 |
| 2006/0157540 | A1 | * | 7/2006 | Sumita ................ B23K 3/0623 228/180.22 |
| 2008/0169337 | A1 | * | 7/2008 | Callahan ............... B23K 1/018 228/264 |
| 2016/0175958 | A1 | * | 6/2016 | Mochizuki ............ B23K 1/018 228/20.1 |

\* cited by examiner

SOLDER REMOVAL FROM SEMICONDUCTOR DEVICES

TECHNICAL FIELD

The present disclosure generally relates to semiconductor devices, and more particularly relates to solder removal from semiconductor devices.

BACKGROUND

Packaged semiconductor dies, including memory chips, microprocessor chips, and imager chips, typically include one or more semiconductor dies mounted on a substrate and encased in a plastic protective covering or covered by a heat-conducting lid. The die can include functional features, such as memory cells, processor circuits, and/or imager devices, as well as bond pads electrically connected to the functional features. The bond pads can be electrically connected to terminals outside the protective covering to allow the die to be connected to higher level circuitry.

To avoid packaging a defective or "bad" die with a number of working or "good" dies (and thereby potentially rendering all of the dies in a package unusable), semiconductor dies may be tested before assembly to identify good and bad dies. Some testing approaches involve forming semi-permanent solder connections to contact pads on a semiconductor die, which may need to be removed before subsequent packaging and/or assembly steps. Traditional approaches to removing solder from semiconductor dies, such as vacuum suction, solder wicking and the like, can cause solder contamination or other damage to the semiconductor die. Accordingly, it is desirable to provide methods and structures for removing solder from semiconductor devices in a way that prevents damage to and/or contamination of the semiconductor devices.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, some approaches to testing a semiconductor device involve forming semi-permanent solder connections to contact pads on the semiconductor device, which may need to be removed before subsequent packaging and/or assembly steps. Accordingly, several embodiments of solder removal structures and methods in accordance with the present technology can remove multiple solder features from a semiconductor device in a way that prevents damage to and/or contamination of the semiconductor device.

Several embodiments of the present technology are directed to solder removal apparatuses and methods. In one embodiment, a solder removal apparatus includes a plurality of solder-interfacing protrusions extending from a body by a length. Each of the plurality of solder-interfacing protrusions is configured to remove a corresponding one of a plurality of solder features from a semiconductor device, where each of the plurality of solder features has a height and an amount of solder material. A method of removing the plurality of solder features can include reflowing the plurality of solder features, inserting the corresponding plurality of the solder-interfacing protrusions into the reflowed plurality of solder features, and removing the amount of solder material of each of the reflowed plurality of solder features from the semiconductor device by either capillary action or vacuum suction.

Specific details of several embodiments of semiconductor devices are described below. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

Figure 1A:
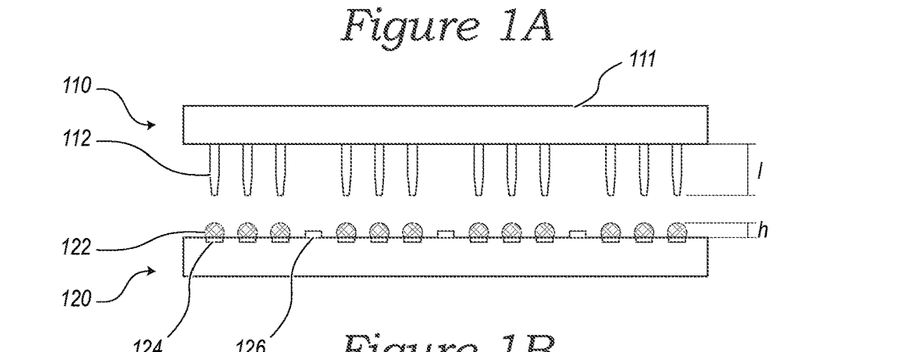
FIGS. 1A through 1D illustrate a solder removal apparatus in various states of a solder removal operation in accordance with an embodiment of the present technology.

FIGS. 1A through 1D illustrate a solder removal apparatus in various states of a solder removal operation in accordance with an embodiment of the present technology. In FIG. 1A, a solder removal apparatus 110 is shown positioned above a semiconductor device 120. The solder removal apparatus 110 includes a plurality of solder-interfacing protrusions 112 that extend from a body 111 of the solder removal apparatus 110 by a length l. As can be seen with reference to FIG. 1A, the plurality of solder-interfacing protrusions 112 are arranged in a pattern corresponding to the pattern in which a plurality of solder features 122 (e.g., solder balls, bumps, or the like) are arranged on the semiconductor device 120. In this regard, the arrangement of solder-interfacing protrusions 112 can be configured to interface with a known pattern of test pads on the semiconductor device 120, such as test pads 124, on which the solder features 122 are disposed, without interfering with (e.g., contacting) other surface-mounted or protruding structures (such as structures 126) on the semiconductor device 120. Although the pattern of solder-interfacing protrusions 112 and solder features 122 are shown in partial cross-section in FIG. 1A, one skilled in the art will readily appreciate that a two dimension pattern of both solder features 122 (e.g., corresponding to a two-dimensional array of test pads 124) and solder-interfacing protrusions 112 could also be used.

The length l by which the solder-interfacing protrusions 112 extends from the body 111 of the solder removal apparatus 110 is greater than the height h by which the solder features 122 extend above a surface (e.g., the surface of the test pads 124) of the semiconductor device 120. This greater length ensures that when the solder-interfacing protrusions 112 are inserted into the solder features 122 (as set forth in greater detail below), no solder will interface with (e.g., wet to or otherwise come into contact with) the body 111 of the solder removal apparatus 110.

Although the solder-interfacing protrusions 112 of the solder removal apparatus 110 are all illustrated in FIG. 1A as extending from the body 111 of the solder removal apparatus 110 by the same length l, one skilled in the art will readily appreciate that the pattern of solder-interfacing protrusions 112 may include not only a pattern of lateral spacing, but also a pattern of differing lengths. In accordance with one aspect of the present technology, such differing lengths may be provided to interface with solder features that extend upwardly from non-coplanar surfaces (e.g., solder features on an upper surface of an interposer, or an upper die in a stack, etc.). Alternatively, solder-interfacing protrusions 112 may be provided with different lengths to interface with solder features having different amounts of solder material (e.g., where a solder-interfacing protrusion may be used to support a larger volume of solder, its length or other dimensions may be increased to accommodate supporting the larger volume of solder).

Figure 1B:
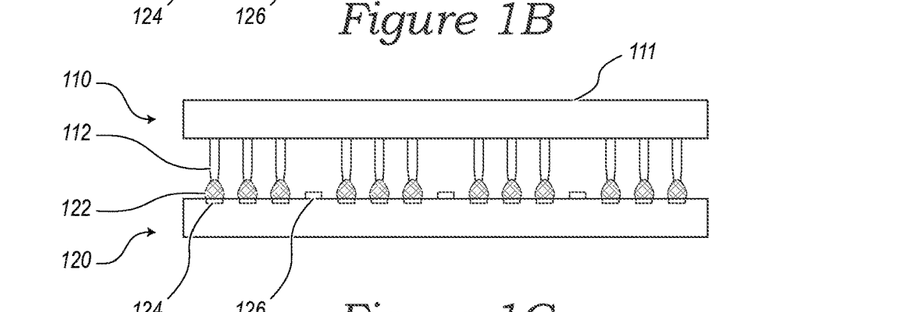

Turning to FIG. 1B, the solder removal apparatus 110 is shown during an insertion of the solder-interfacing protrusions 112 into the solder features 122 in accordance with an embodiment of the present technology. This operation can be performed after heating the solder features 122 until they have reflowed. The operation can also be performed after heating the solder-interfacing protrusions 112 of the solder removal apparatus 110. The solder-interfacing protrusions 112 can be heated conductively (e.g., by conducting heat into the solder removal apparatus 110, through mechanical connection to a resistive heater or the like), convectively (e.g., by disposing the solder removal apparatus 110 in a heated environment such as a burn-in oven in which the semiconductor device 120 is also heated), or some combination thereof. By using a material for the solder-interfacing protrusions 112 that is solder-wettable (e.g., copper, tin, gold, silver, nickel, etc.), capillary action will cause the reflowed solder features 122 to wick onto the solder-interfacing protrusions 112.

Figures 1C, 1D:
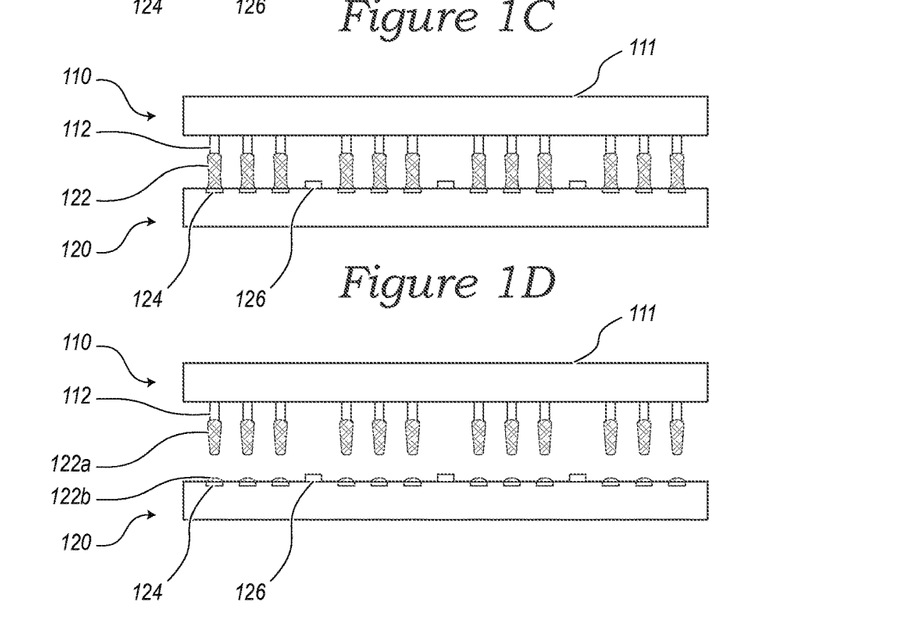

FIG. 1C illustrates the solder removal apparatus 110 after the solder-interfacing protrusions 112 have been fully inserted into the solder features 122 (e.g., such that a distance between the body 111 of the solder removal apparatus 110 and the semiconductor device 120 is about equal to the length l of the solder-interfacing protrusions 112) in accordance with an embodiment of the present technology. By fully inserting the solder-interfacing protrusions 112 into the solder features 122, the contact between the solder-interfacing protrusions 112 and the solder features 122 is maximized, causing all or nearly all of the solder material of the solder features 122 to wick onto the solder-interfacing protrusions 112. As can be seen with reference to FIG. 1C, the matching patterns of the solder-interfacing protrusions 112 and the solder features 122 allow all of the solder features 122 to be removed from the semiconductor device 120 simultaneously, without interfering with other surface-mounted or protruding structures (such as structures 126) on the semiconductor device 120.

Turning to FIG. 1D, the solder removal apparatus 110 is illustrated after having been removed from the semiconductor device 120, in accordance with one embodiment of the present technology. As can be seen with reference to FIG. 1D, the solder material 122a of the solder features 122 has been wicked onto the solder-interfacing protrusions 112 and carried away with the solder removal apparatus 110, leaving little or no solder material 122b remaining on the test pads 124. According to one aspect of the subject technology, the amount of solder material 122b left on the test pads 124 can be controlled by adjusting a relative wettability of the solder-interfacing protrusions 112 and the test pads 124, and/or the relative dimensions of the solder-interfacing protrusions 112 and the test pads 124.

Figure 2:
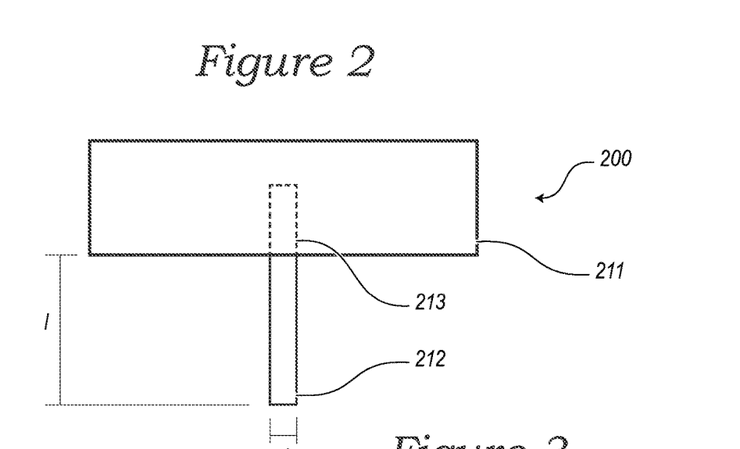
FIG. 2 illustrates a solder-interfacing protrusion of a solder removal apparatus in accordance with an embodiment of the present technology.

Moreover, the solder-interfacing protrusions of a solder removal device configured in accordance with an embodiment of the present technology can be configured to have a surface area sufficient to support the entire volume of solder of a solder feature to be removed. For example, FIG. 2 illustrates in partial cross-section a single solder-interfacing protrusion 212 extending from a body 211 of a solder removal apparatus 200. The solder-interfacing protrusion 212 is substantially cylindrical in shape, having a diameter d and extending from the body 211 by a length l, such that a surface area of the solder-interfacing protrusion 212 can be calculated as $(l \times d \times \pi)+(0.25 \times \pi \times d^2)$. Accordingly, given the wettability of the material of solder-interfacing protrusion 212, the volume of solder that the solder-interfacing protrusion 212 is capable of supporting can be configured by varying the length l and the diameter d.

As can be seen with reference to FIG. 2, the solder-interfacing protrusion 212 can include a portion 213 extending into the body 211. In accordance with one aspect of the present technology, the solder-interfacing protrusion 212 can be removably attached to the body 211 (e.g., friction fit, threaded, or otherwise removably inserted), to facilitate the removal of the solder-interfacing protrusion 212 either to recondition (e.g., by removing built-up solder and/or intermetallics with etching, an acid bath or some other technique well known to those skilled in the art) or to replace the solder-interfacing protrusion 212 after one or more uses.

Figure 3:
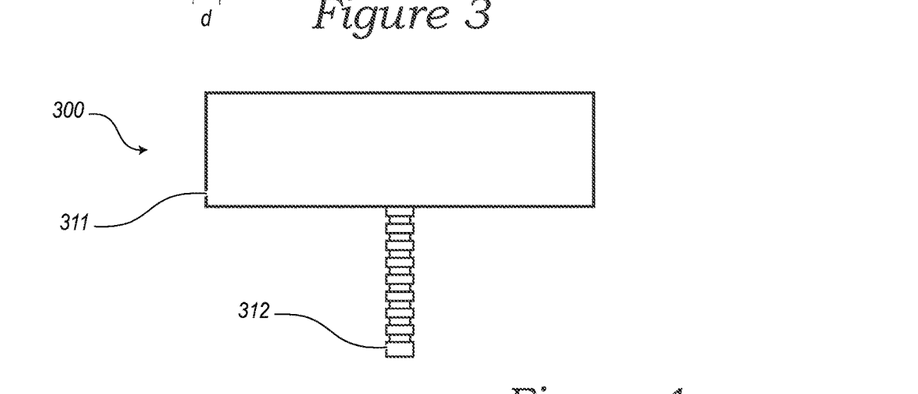
FIG. 3 illustrates a solder-interfacing protrusion of a solder removal apparatus in accordance with an embodiment of the present technology.
Figure 4:
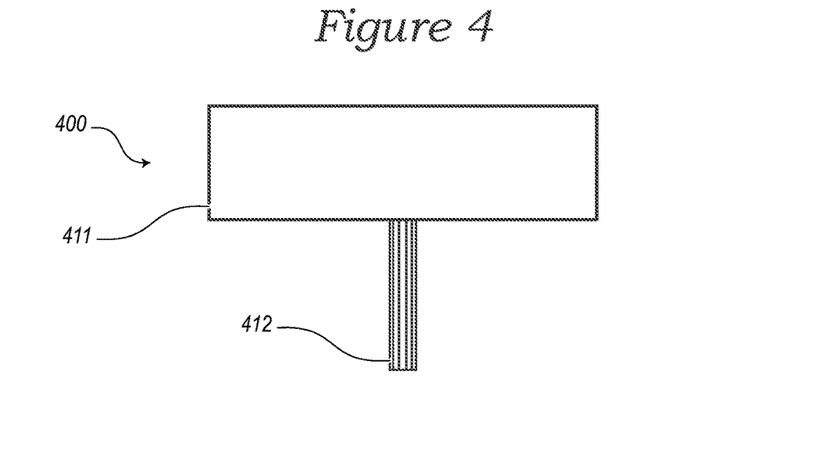
FIG. 4 illustrates a solder-interfacing protrusion of a solder removal apparatus in accordance with an embodiment of the present technology.

In accordance with one aspect of the present technology, the surface area of a solder-interfacing protrusion can be varied in any one of a number of ways. For example, FIGS. 3 and 4 illustrate in partial cross-section solder-interfacing protrusions having surface features configured to increase a surface area thereof above that of a cylinder with an equivalent volume. For example, FIG. 3 illustrates a single solder-interfacing protrusion 312 extending from a body 311 of a solder removal apparatus 300. The solder-interfacing protrusion 312 includes a number of annular ridges and/or depressions that increase its surface area relative to a smooth cylindrical pin (e.g., the solder-interfacing protrusion 212 of FIG. 2) displacing the same volume. Similarly, FIG. 4 illustrates a single solder-interfacing protrusion 412 extending from a body 411 of a solder removal apparatus 400, where the solder-interfacing protrusion 412 includes a number of vertical ridges and/or depressions that increase its surface area relative to a smooth cylindrical pin (e.g., the solder-interfacing protrusion 212 of FIG. 2).

Figures 5A, 5B, 5C:
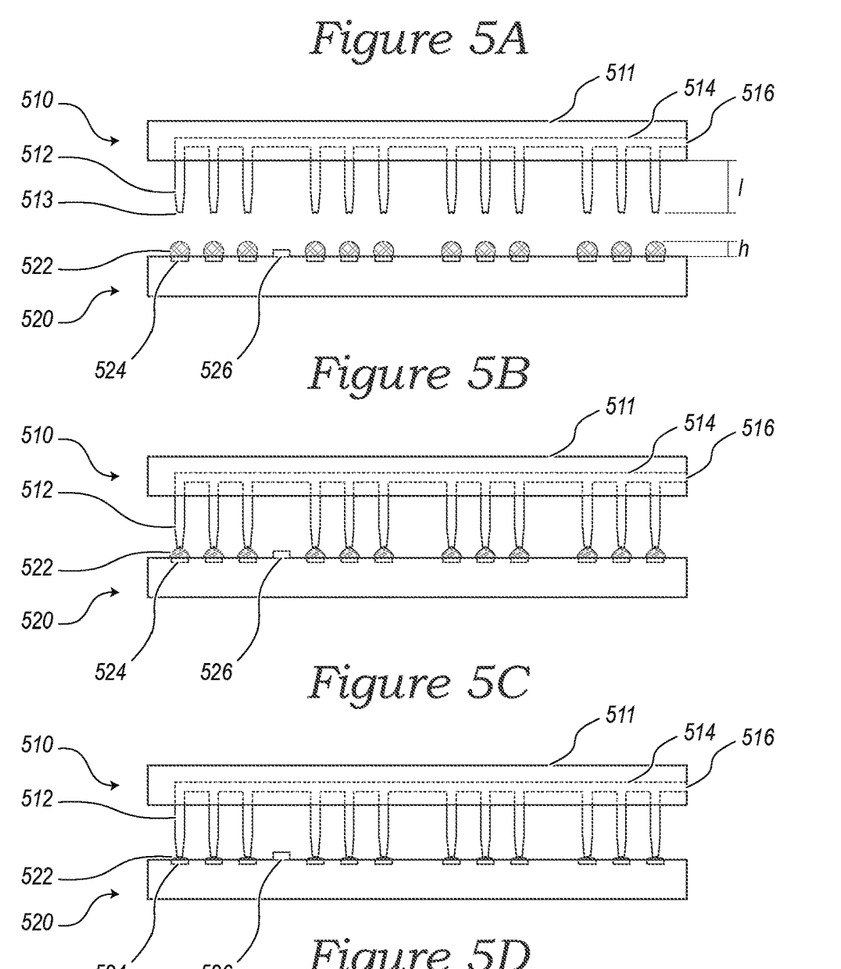
FIGS. 5A through 5D illustrate a solder removal apparatus in various states of a solder removal operation in accordance with an embodiment of the present technology.

Although in the foregoing exemplary embodiments, solder removal apparatuses have been illustrated and described as utilizing capillary action to removal solder from semiconductor devices, in other embodiments of the present technology vacuum suction may be used instead. For example, FIGS. 5A through 5D illustrate a solder removal apparatus in various states of a solder removal operation in accordance with an embodiment of the present technology. In FIG. 5A, a solder removal apparatus 510 is shown positioned above a semiconductor device 520. The solder removal apparatus 510 includes a plurality of solder-interfacing protrusions 512 that extend from a body 511 of the solder removal apparatus 510 by a length l. The solder removal apparatus 510 further includes a vacuum channel 514 operably coupling openings 513 at the end of each solder-interfacing protrusion 512 to a vacuum port 516, to facilitate the connection of each solder-interfacing protrusion 512 to a common vacuum source. As can be seen with reference to FIG. 5A, the plurality of solder-interfacing protrusions 512 are arranged in a pattern corresponding to the pattern in which a plurality of solder features 522 (e.g., solder balls, bumps, or the like) are arranged on the semiconductor device 520. In this regard, the arrangement of solder-interfacing protrusions 512 can be configured to interface with a known pattern of test pads on the semiconductor device 520, such as test pads 524 on which the solder features 522 are disposed, without interfering with (e.g., contacting) other surface-mounted or protruding structures (such as structures 526) on the semiconductor device 520. Although the pattern of solder-interfacing protrusions 512 and solder features 522 are shown in partial cross-section in FIG. 5A, one skilled in the art will readily appreciate that a two dimension pattern of both solder features 522 (e.g., corresponding to a two-dimensional array of test pads 524) and solder-interfacing protrusions 512 could also be used.

The length l by which the solder-interfacing protrusions 512 extends from the body 511 of the solder removal apparatus 510 is greater than the height h by which the solder features 522 extend above a surface (e.g., the surface of the test pads 524) of the semiconductor device 520. This greater length ensures that when the solder-interfacing protrusions 512 are inserted into the solder features 522 (as set forth in greater detail below), no solder will interface with (e.g., wet to or otherwise come into contact with) the body 511 of the solder removal apparatus 510. In accordance with one aspect of the present technology, the solder-interfacing protrusions 512 can be removably attached to the body 510 (e.g., by friction fitting, threading, etc.) to facilitate the cleaning or replacement thereof.

Although the solder-interfacing protrusions 512 of solder removal apparatus 510 are all illustrated in FIG. 5A as extending from the body 511 of the solder removal apparatus 510 by the same length l, one skilled in the art will readily appreciate that the pattern of solder-interfacing protrusions 512 may include not only a pattern of lateral spacing, but also a pattern of differing lengths. In accordance with one aspect of the present technology, such differing lengths may be provided to interface with solder features that extend upwardly from non-coplanar surfaces (e.g., solder features on an upper surface of an interposer, or an upper die in a stack, etc.).

Turning to FIG. 5B, the solder removal apparatus 510 is shown during an insertion of the solder-interfacing protrusions 512 into the solder features 522 in accordance with an embodiment of the present technology. This operation can be performed after heating the solder features 522 until they have reflowed. The operation can also be performed after heating the solder-interfacing protrusions 512 of the solder removal apparatus 510. The solder-interfacing protrusions 512 can be heated conductively (e.g., by conducting heat into the solder removal apparatus 510, through mechanical connection to a resistive heater or the like), convectively (e.g., by disposing the solder removal apparatus 510 in a heated environment such as a burn-in oven in which the semiconductor device 520 is also heated), or some combination thereof. By using a material for the solder-interfacing protrusions 512 that is not solder-wettable (e.g., ceramic, titanium, chromium, tantalum, etc.), the reflowed solder features 522 will not wick onto the solder-interfacing protrusions 512, but will rather be removed by vacuum suction through the vacuum channel 514 to the vacuum port 516 (e.g., where the solder material can be collected for re-use or disposal). Although in the foregoing embodiment of FIGS. 5A to 5D, the solder removal apparatus 510 is illustrated as having a single vacuum channel 514 and a single vacuum port 516, one skilled in the art will readily appreciate that the openings 513 of the solder-interfacing protrusions 512 can be operably coupled via one or more vacuum channels to one or more vacuum ports.

FIG. 5C illustrates the solder removal apparatus 510 after the solder-interfacing protrusions 512 have been fully inserted into the solder features 522 (e.g., such that a distance between the body 511 of the solder removal apparatus 510 and the semiconductor device 520 is about equal to the length l of the solder-interfacing protrusions 512) in accordance with an embodiment of the present technology. By fully inserting the solder-interfacing protrusions 512 into the solder features 522, the openings 513 of each solder-interfacing protrusion 512 is able to apply vacuum suction to removal all or mostly all of the solder material of the solder features 522. As can be seen with reference to FIG. 5C, the matching patterns of the solder-interfacing protrusions 512 and the solder features 522 allow all of the solder features 522 to be removed from the semiconductor device 520 simultaneously, without interfering with other surface-mounted or protruding structures (such as structures 526) on the semiconductor device 520.

Figure 5D:
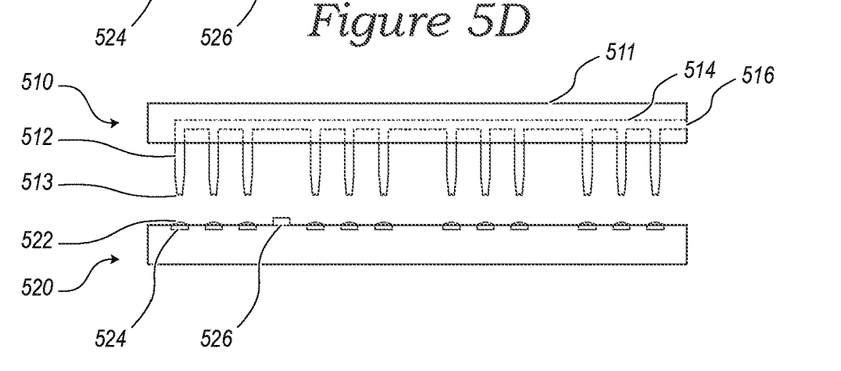

Turning to FIG. 5D, the solder removal apparatus 510 is illustrated after having been removed from the semiconductor device 520, in accordance with one embodiment of the present technology. As can be seen with reference to FIG. 5D, the solder material of the solder features 522 has been almost completely vacuumed through the vacuum channel and out through the vacuum port 516, leaving little or no solder material remaining on the test pads 524.

Although in the foregoing exemplary embodiments, solder removal apparatuses have been illustrated and described as removing solder features from a single semiconductor device, one skilled in the art will readily appreciate that a solder removal apparatus may include a plurality of solder-interfacing protrusions configured to interface with solder features on a number of semiconductor devices at the same time. For example, a solder removal apparatus may include a pattern of solder-interfacing protrusions configured to interface with solder features on a field of multiple semiconductor devices of a wafer, or with solder features on an entire wafer or panel of semiconductor devices, or the like.

Figure 6:
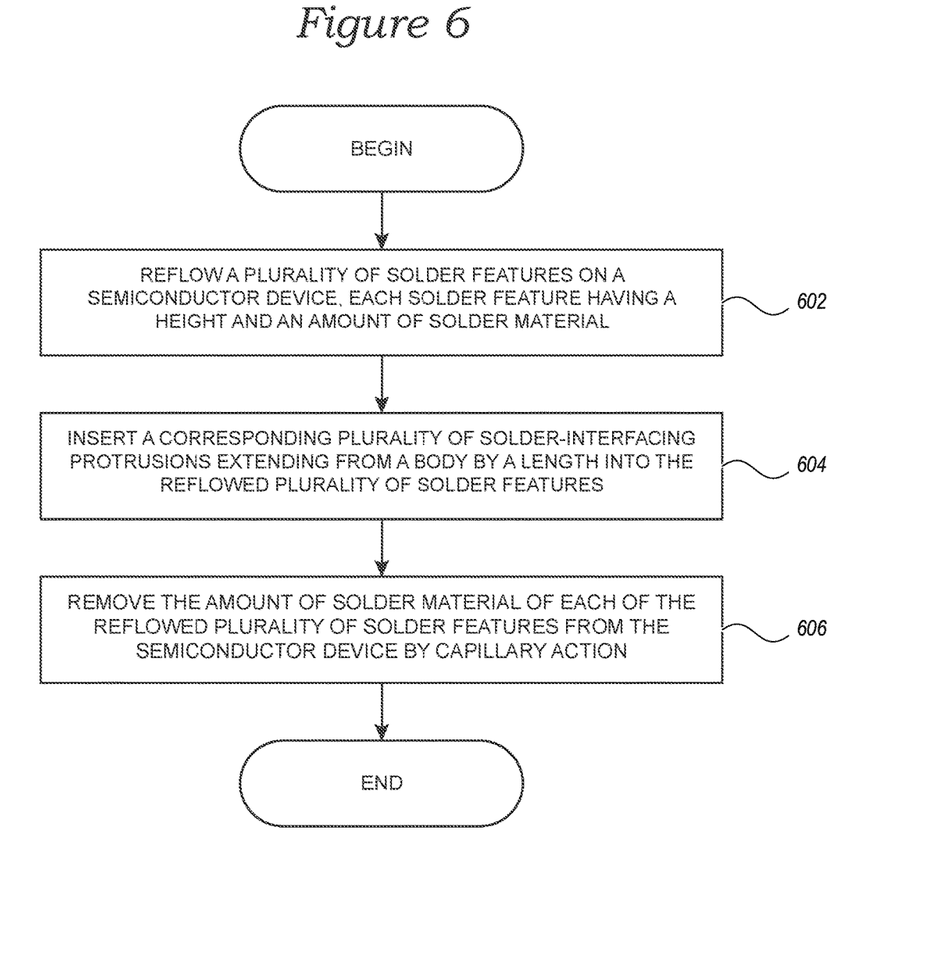
FIG. 6 is a flow chart illustrating a method of removing solder from a semiconductor device in accordance with an embodiment of the present technology.

FIG. 6 illustrates a method of removing a plurality of solder features from a semiconductor device in accordance with an embodiment of the present technology, where each of the plurality of solder features has a height and an amount of solder material. The method includes reflowing the plurality of solder features (box 602) and inserting a corresponding plurality of solder-interfacing protrusions extending from a body by a length into the reflowed plurality of solder features (box 604). The method further includes removing the amount of solder material of each of the reflowed plurality of solder features from the semiconductor device by capillary action of the solder material onto the corresponding one of the plurality of solder-interfacing protrusions (box 606).

Figure 7:
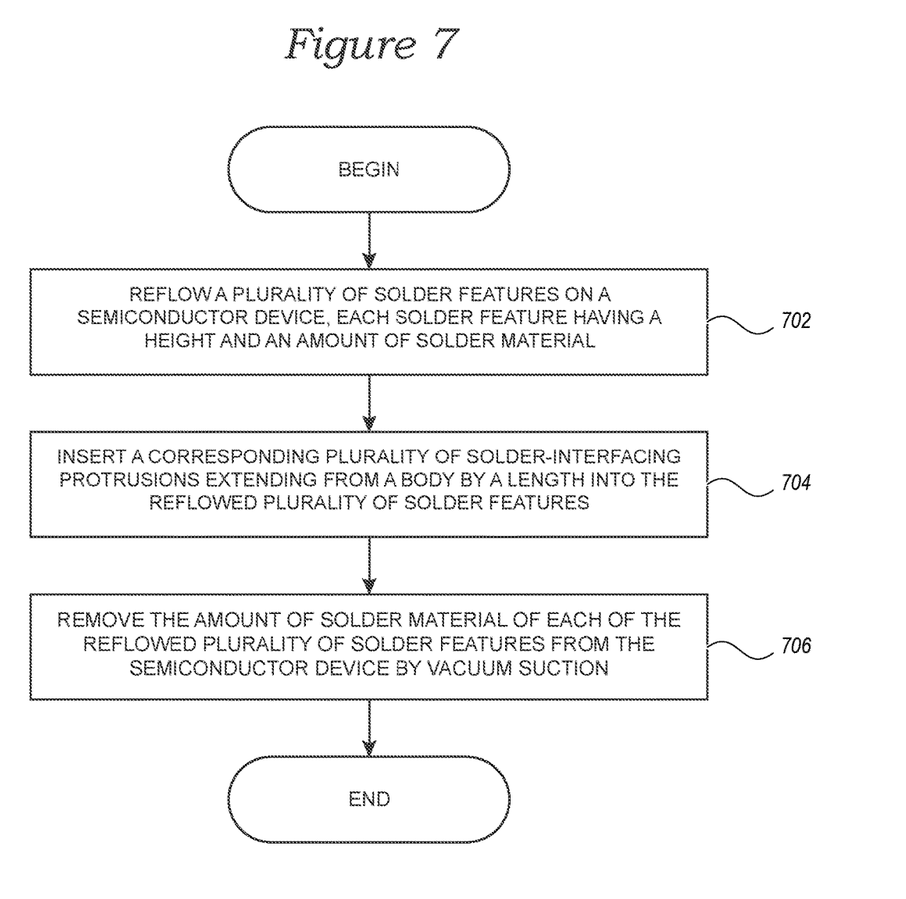
FIG. 7 is a flow chart illustrating a method of removing solder from a semiconductor device in accordance with an embodiment of the present technology.

FIG. 7 illustrates a method of removing a plurality of solder features from a semiconductor device in accordance with an embodiment of the present technology, where each of the plurality of solder features has a height and an amount of solder material. The method includes reflowing the plurality of solder features (box 702) and inserting a corresponding plurality of solder-interfacing protrusions extending from a body by a length into the reflowed plurality of solder features (box 704). The method further includes removing the amount of solder material of each of the reflowed plurality of solder features from the semiconductor device by vacuum suction of the solder material onto the corresponding one of the plurality of solder-interfacing protrusions (box 706).

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A solder removal apparatus, comprising:
a plurality of solder-interfacing elongated solid pins extending from a body by a length, each of the plurality of solder-interfacing elongated solid pins having an outer surface of solder-wettable material configured to remove a corresponding one of a plurality of solder features from a semiconductor device, each of the plurality of solder features having a height and an amount of solder material, wherein the outer surface of at least one of the plurality of solder-interfacing elongated solid pins has an area sufficient to support the amount of solder material of the corresponding one of the plurality of solder features.

2. The solder removal apparatus of claim 1, wherein the plurality of solder-interfacing elongated solid pins are arranged in a first pattern corresponding to a second pattern in which the plurality of solder features of the semiconductor device are arranged.

3. The solder removal apparatus of claim 1, wherein the length of each solder-interfacing elongated solid pin is greater than the height of the corresponding one of the plurality of solder features.

4. The solder removal apparatus of claim 1, wherein at least one of the plurality of solder-interfacing elongated solid pins tapers from a first cross-sectional area closer to the body to a second cross-sectional area less than the first cross-sectional area further from the body.

5. The solder removal apparatus of claim 1, wherein at least one of the plurality of solder-interfacing elongated solid pins has a greater surface area than that of a cylindrical pin having the same length and displacing the same volume.

6. The solder removal apparatus of claim 1, wherein each solder-interfacing elongated solid pins is removably attached to the body.

* * * * *